United States Patent
Sugino et al.

(10) Patent No.: US 8,647,969 B1
(45) Date of Patent: Feb. 11, 2014

(54) METHOD FOR FORMING A SEMICONDUCTOR LAYER WITH IMPROVED GAP FILLING PROPERTIES

(75) Inventors: Rinji Sugino, San Jose, CA (US); Yider Wu, Taipei County (TW); Minh Van Ngo, Fremont, CA (US); Jeffrey Sinclair Glick, Cupertino, CA (US); Kuo Tung Chang, Saratoga, CA (US)

(73) Assignee: Spansion LLC, Sunnyvale, CA (US)

( * ) Notice: Subject to any disclaimer, the term of this patent is extended or adjusted under 35 U.S.C. 154(b) by 46 days.

(21) Appl. No.: 13/362,899

(22) Filed: Jan. 31, 2012

Related U.S. Application Data

(63) Continuation of application No. 11/189,875, filed on Jul. 27, 2005, now Pat. No. 8,133,801.

(51) Int. Cl.
*H01L 21/20* (2006.01)

(52) U.S. Cl.
USPC .................................. 438/488; 257/E21.002

(58) Field of Classification Search
USPC ........................................................ 438/266
See application file for complete search history.

(56) References Cited

U.S. PATENT DOCUMENTS

| | | | |
|---|---|---|---|
| 4,373,248 A | 2/1983 | McElroy | |
| 4,401,687 A | 8/1983 | Rosler et al. | |
| 4,996,571 A * | 2/1991 | Kume et al. | 365/185.19 |
| 5,308,788 A | 5/1994 | Fitch et al. | |
| 5,786,027 A | 7/1998 | Rolfson | |
| 6,184,093 B1 | 2/2001 | Sung | |
| 6,417,538 B1 * | 7/2002 | Choi | 257/315 |
| 6,429,081 B1 | 8/2002 | Doong et al. | |
| 6,444,507 B1 | 9/2002 | Miyasaka | |
| 6,720,612 B2 * | 4/2004 | Takeuchi et al. | 257/315 |
| 6,780,694 B2 | 8/2004 | Doris et al. | |
| 7,091,072 B2 | 8/2006 | Park et al. | |
| 2002/0125536 A1 * | 9/2002 | Iwasa et al. | 257/368 |
| 2004/0097080 A1 | 5/2004 | Kim et al. | |
| 2004/0113196 A1 | 6/2004 | Rudeck et al. | |
| 2004/0131528 A1 | 7/2004 | Kendig et al. | |
| 2005/0051833 A1 * | 3/2005 | Wang et al. | 257/315 |
| 2005/0106842 A1 | 5/2005 | Luoh | |
| 2007/0042548 A1 | 2/2007 | Noh et al. | |

FOREIGN PATENT DOCUMENTS

KR    10-2003-0048206    6/2003

OTHER PUBLICATIONS

Co-pending U.S. Appl. No. 11/189,875, filed Jul. 27, 2005 entitled "Method for Forming a Semiconductor Layer With Improved Gap Filling Properties" by Rinji Sugino et al., 21 pages.

W. Zhang et al., "Selective epitaxial growth using dichlorosilane and silane by low pressure chemical vapor deposition", Microelectronic Engineering 73-74, 2004, pp. 514-518.

* cited by examiner

*Primary Examiner* — Eva Yan Montalvo
(74) *Attorney, Agent, or Firm* — Harrity & Harrity, LLP

(57) ABSTRACT

A method of manufacturing a memory device includes forming a first dielectric layer over a substrate, forming a charge storage element over the first dielectric layer and forming an inter-gate dielectric over the charge storage element. The method also includes depositing a silicon control gate layer over the inter-gate dielectric using a reactant that contains chlorine.

20 Claims, 5 Drawing Sheets

METHOD FOR FORMING A SEMICONDUCTOR LAYER WITH IMPROVED GAP FILLING PROPERTIES

RELATED APPLICATION

This application is a continuation of Ser. No. 11/189,875, filed Jul. 27, 2005, the disclosure of which is incorporated by reference herein in its entirety.

TECHNICAL FIELD

The present invention relates generally to semiconductor devices and methods of manufacturing semiconductor devices. The invention has particular applicability to forming semiconducting layers with improved gap filling properties.

BACKGROUND ART

The escalating demands for high density and performance associated with non-volatile memory devices require small design features, high reliability and increased manufacturing throughput. The reduction of design features, however, challenges the limitations of conventional methodology. For example, the reduction of design features makes it difficult for the memory device to meet its expected data retention requirement.

In particular, one problem associated with the formation of a memory device, such as an electrically erasable programmable read only memory (EEPROM) device, involves the gap filling capabilities of various materials, such as polycrystalline silicon. For example, it is often difficult to deposit a polycrystalline control gate layer that fills all the space between adjacent memory cells. This often leads to gaps or voids in the control gate layer. Such gaps or voids in the control gate layer may lead to open circuits, charge leakage problems, etc. These gaps or voids may also make it difficult to program and/or erase the memory device in an efficient manner and, ultimately, may lead to device failure.

DISCLOSURE OF THE INVENTION

According to one aspect consistent with the invention, a method of manufacturing a memory device is provided. The method includes forming a first dielectric layer over a substrate and forming a charge storage element over the first dielectric layer. The method also includes forming an inter-gate dielectric over the charge storage element. The method further includes depositing a silicon control gate layer over the inter-gate dielectric using a reactant that contains chlorine.

According to another aspect consistent with the invention, a method of forming a semiconductor device includes forming a first dielectric layer over a substrate and forming a plurality of charge storage structures over the first dielectric layer. The method also includes forming an inter-gate dielectric over the plurality of charge storage structures, where an opening is formed between adjacent ones of the charge storage structures. The method further includes depositing a silicon layer over the inter-gate dielectric using a chemical vapor deposition process, the silicon layer filling the opening. The depositing includes providing a reactant containing chlorine to a deposition chamber.

According to a further aspect consistent with the invention, a method of forming a semiconductor device includes forming a first dielectric layer over a substrate and forming a plurality of charge storage structures over the first dielectric layer. The method also includes forming an inter-gate dielectric over the plurality of charge storage structures, where an opening is formed between adjacent ones of the charge storage structures. The method further includes depositing a silicon layer over the inter-gate dielectric, the silicon layer filling the opening. The depositing includes depositing at least a portion of the silicon layer using a reactant that includes chlorine.

Other advantages and features of the invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, wherein elements having the same reference number designation may represent like elements throughout.

BEST MODE FOR CARRYING OUT THE INVENTION

Implementations consistent with the invention reduce problems in a memory device by depositing a conductive layer with improved gap filling properties.

Additional advantages and other features of the invention will be set forth in part in the description which follows and in part will become apparent to those having ordinary skill in the art upon examination of the following or may be learned from the practice of the invention. The advantages and features of the invention may be realized and obtained as particularly pointed out in the appended claims.

Figure 1:
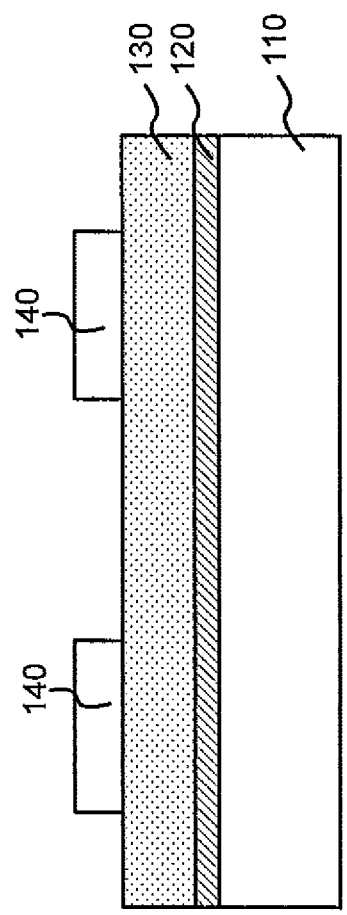
FIG. 1 is a cross-section illustrating exemplary layers used to form one or more charge storage structures for a semiconductor device in accordance with an embodiment of the invention.

FIG. 1 illustrates the cross-section of a semiconductor device 100 formed in accordance with an embodiment of the invention. Referring to FIG. 1, semiconductor device 100 may include layers 110, 120 and 130. In an exemplary embodiment, layer 110 may be a substrate of semiconductor device 100 and may include silicon, germanium, silicon-germanium or other semiconducting materials. In alternative implementations, layer 110 may be a conductive layer or a dielectric layer formed a number of layers above the surface of a substrate in semiconductor device 100.

Layer 120 may be a dielectric layer formed on layer 110 in a conventional manner. In an exemplary implementation, dielectric layer 120 may include an oxide, such as a silicon oxide (e.g., $SiO_2$), and may have a thickness ranging from about 25 angstroms (Å) to about 250 Å. Dielectric layer 120 may function as a tunnel oxide layer for one or more subsequently formed memory cells of semiconductor device 100.

Layer 130 may be formed on layer 120 in a conventional manner and may include a conductive material, such as polycrystalline silicon. Layer 130, consistent with the invention, may have a thickness ranging from about 100 Å to about 1,000 Å and may act as a floating gate layer or charge storage layer for semiconductor device 100. In alternative implementations, layer 130 may include a dielectric material, such as a nitride (e.g., a silicon nitride) or an oxynitride, that acts as a charge storage layer for semiconductor device 100.

A photoresist material may be patterned and etched to form masks 140 on the top surface of layer 130, as illustrated in FIG. 1. Masks 140 may be used to facilitate formation of one or floating gate electrodes or charge storage elements in semiconductor device 100, as described in more detail below.

Figure 2:
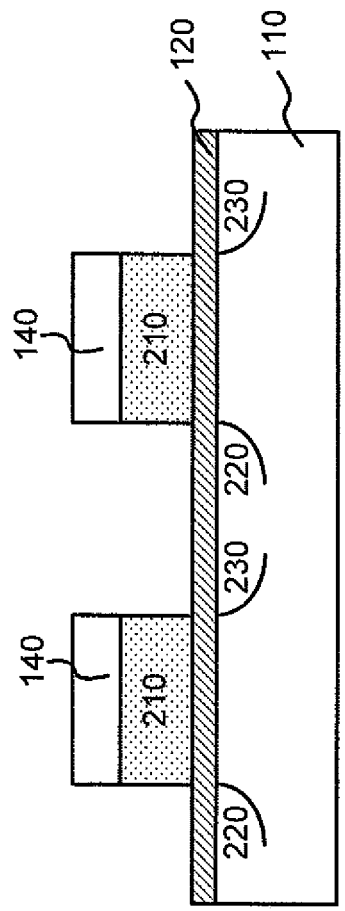
FIG. 2 is a cross-section illustrating the formation of charge storage structures for a semiconductor device in accordance with an embodiment of the invention.

Semiconductor device 100 may then be etched, as illustrated in FIG. 2. Referring to FIG. 2, layer 130 may be etched in a conventional manner with the etching terminating at layer 120, thereby forming structures 210 from layer 130. Alternatively, the etching may terminate at an other layer, such as layer 110. Each structure 210 may represent a floating gate electrode or charge storage element of semiconductor device 100. Only two structures 210 are shown in FIG. 2 for simplicity. It should be understood that a typical memory device may include a large number of memory cells that each contain a floating gate electrode/charge storage element.

Source and drain regions 220 and 230 may be formed in substrate 110, as illustrated in FIG. 2. For example, n-type or p-type impurities may be implanted in substrate 110 to form source and drain regions 220 and 230, based on the particular end device requirements. The particular implantation dosages and energy used to form source and drain regions 220 and 230 may be selected based on the particular end device requirements. One of ordinary skill in the art would be able to optimize the source/drain implantation process based on the particular circuit requirements. It should also be understood that source region 220 and drain region 230 may alternatively be formed at other points in the fabrication process of semiconductor device 100.

Sidewall spacers (not shown) may also be formed prior to the source/drain ion implantation to control the location of the source/drain junctions based on the particular circuit requirements. The spacers may include a dielectric material, such as a silicon oxide, a silicon nitride, a silicon oxynitride or another dielectric material, may be deposited and etched to form spacers on each side of structures 210. The spacers may be used to facilitate the deposition of impurities in semiconductor device 100. The spacers may also be used to electrically isolate adjacent memory cells from each other.

Figure 3:
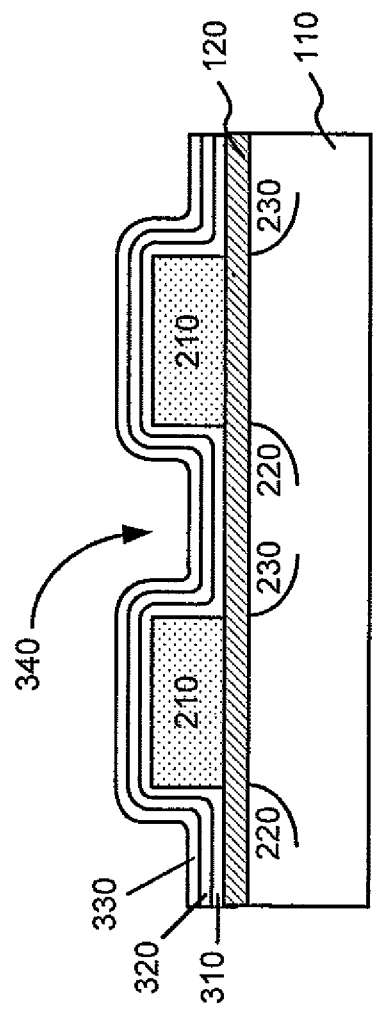
FIG. 3 is a cross-section illustrating the formation of an inter-gate dielectric on the semiconductor device of FIG. 2 in accordance with an embodiment of the invention.

Photoresist masks 140 may then be removed. A number of films may then be deposited over semiconductor device 100. In an exemplary implementation, an oxide-nitride-oxide (ONO) stack may be formed over semiconductor device 100. For example, an oxide layer 310, such as a silicon oxide (e.g., $SiO_2$) may be formed over semiconductor device 100, as illustrated in FIG. 3. In an exemplary implementation, oxide layer 310 may be deposited or thermally grown to a thickness ranging from about 15 Å to about 150 Å. Next, a nitride layer 320, such as a silicon nitride (e.g., $Si_3N_4$) may be formed over oxide layer 310, as illustrated in FIG. 3. In an exemplary implementation, nitride layer 320 may be deposited to a thickness ranging from about 15 Å to about 150 Å. Another oxide layer 330 (e.g., $SiO_2$) may be formed over nitride layer 320, as illustrated in FIG. 3. In an exemplary implementation, oxide layer 330 may be deposited to a thickness ranging from about 15 Å to about 150 Å.

Layers 310-330, as described above, may form an ONO stack having a combined thickness ranging from about 45 Å to about 450 Å. The ONO stack acts an inter-gate dielectric for the memory cells of semiconductor device 100.

In alternative implementations, one of more of layers 310-330 may include a material having a high dielectric constant (K), such as aluminum oxide or hafnium oxide, that may be deposited or thermally grown. In still other alternatives, one or more of layers 310-330 may not be needed. For example, the inter-gate dielectric may include an oxide or an oxide-nitride stack.

As illustrated in FIG. 3, the formation of layers 310-330 over structures 210 forms a gap 340 between adjacent structures 210. In situations in which the aspect ratio associated with gap 340 is high (i.e., the depth of gap 340 is much greater than its width), it is difficult to fill gap 340 using conventional processes. For example, it has been found that depositing polycrystalline silicon using a conventional $SiH_4$ (silane) based reaction to fill a gap having an aspect ratio greater than about 0.5 results in gaps or voids in the polycrystalline silicon. Implementations consistent with the invention fill gap 340 without voids, even when the aspect ratio of gap 340 is high, as described in more detail below.

Figure 4:
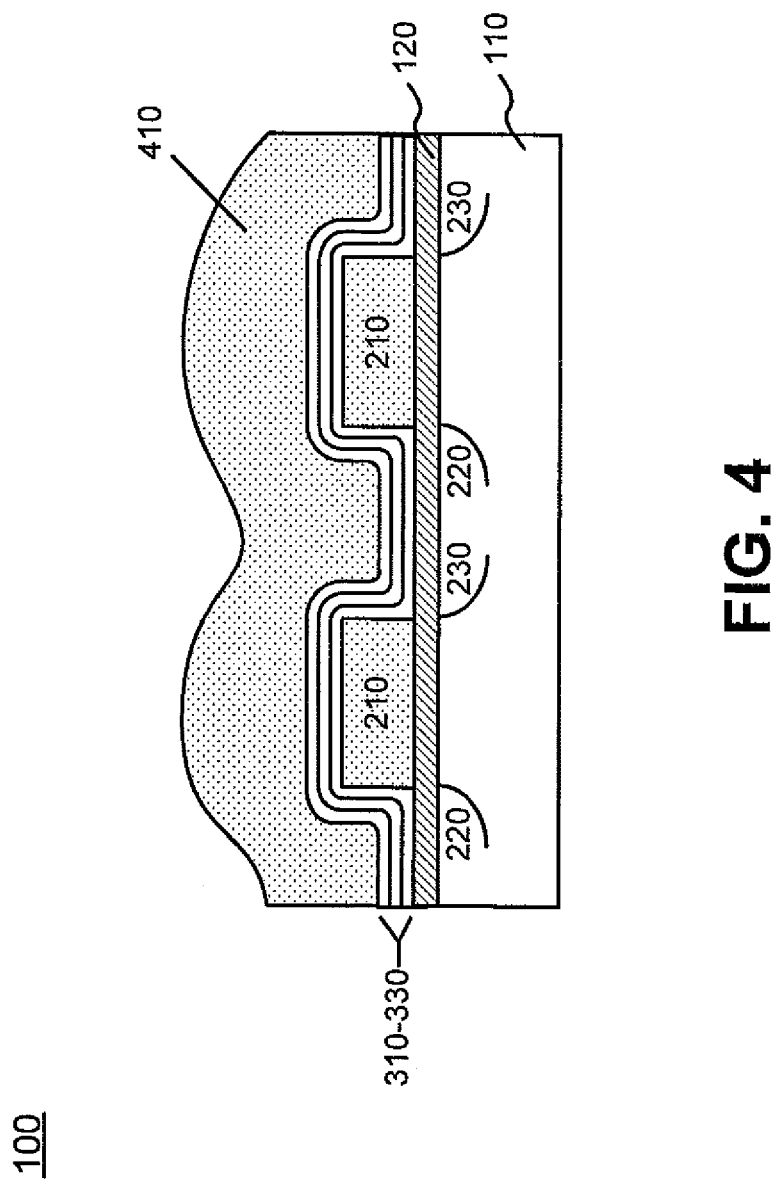
FIG. 4 is a cross-section illustrating the formation of control gate material on the device of FIG. 3 in accordance with an embodiment of the invention.

A conductive layer 410 may deposited over semiconductor device 100, as illustrated in FIG. 4. In an exemplary implementation consistent with the invention, conductive layer 410 may include polycrystalline silicon deposited using $SiH_4$ and dichlorosilane ($SiH_2Cl_2$) reactants. For example, in one implementation consistent with the invention, $SiH_4$ and $SiH_2Cl_2$ may be introduced concurrently with each other into a chemical vapor deposition (CVD) chamber. In this exemplary implementation, the CVD chamber may be prepared with a pressure in the range of 10 mTorr to about 10 Torr and the CVD chamber may be heated to a temperature ranging from about 450° C. to about 800° C.

After the proper pressure and temperature in the CVD chamber are set, $SiH_4$ may be provided into the CVD chamber at a flow rate ranging from about 100 standard cubic centimeters per minute (sccm) to about 10,000 sccm. $SiH_2Cl_2$ may be provided into the CVD chamber concurrently with the $SiH_4$ at a similar flow rate. The reactants (i.e., $SiH_4$ and $SiH_2Cl_2$) may be provided for a period ranging from about 60 seconds to about 3,600 seconds to produce polycrystalline silicon layer 410 having a thickness ranging from about 500 Å to about 3,000 Å. It should be understood that the particular flow rates, pressure range, temperature range and duration may be adjusted based on the desired thickness of polycrystalline layer 410.

As discussed above, $SiH_4$ and $SiH_2Cl_2$ may be provided as reactants to deposit polycrystalline silicon layer 410. It has been found that providing $SiH_4$ and $SiH_2Cl_2$ in a ratio ranging from approximately 1:10 to 10:1 (with respect to flow rates) results in better gap filling properties associated with polycrystalline layer 410. That is, the polycrystalline silicon layer 410 is able to fill small gaps, such as gap 340, even when the aspect ratio of the gap is high. It has also been found that using $SiH_4$ and $SiH_2Cl_2$ in a ratio ranging from approximately 1:10 to 10:1 (with respect to flow rates) reduces the amount of byproducts formed, such as hydrogen gas, that may cause problems.

For example, $H_2$ (hydrogen) gas and HCl (hydrogen chloride) gas may both be byproducts of the reaction to deposit polycrystalline silicon layer 410. The hydrogen gas may cause problems associated with the deposited polycrystalline silicon layer 410. For example, hydrogen may be absorbed into polycrystalline silicon during or after deposition of the polycrystalline silicon layer. The absorbed hydrogen may create non-conductive areas in the polycrystalline silicon or reduce the overall conductivity of the polycrystalline silicon. It has been found that using $SiH_4$ and $SiH_2Cl_2$ at a ratio ranging from approximately 1:10 to 10:1, as discussed above, may reduce hydrogen gas formation by about 50% as compared to using $SiH_4$ alone to deposit polycrystalline silicon. Therefore, reducing the amount of hydrogen byproduct using the deposition process described above advantageously reduces or eliminates the problems created by hydrogen being absorbed into polycrystalline silicon layer 410.

In an alternative embodiment consistent with the invention, $SiH_4$ and tetrachlorosilane ($SiCl_4$) may be used as reactants to form polycrystalline silicon layer 410. For example, in one implementation consistent with the invention, both $SiH_4$ and $SiCl_4$ may be introduced into a CVD chamber. In this exemplary implementation, the CVD chamber may be prepared with a pressure in the range of 10 mTorr to about 10 Torr and the CVD chamber may be heated to a temperature ranging from about 450° C. to about 800° C.

After the proper pressure and temperature in the CVD chamber are set, $SiH_4$ may be provided at a flow rate ranging from about 100 sccm to about 10,000 sccm, $SiCl_4$ may be provided to the CVD chamber concurrently with the $SiH_4$ at a similar flow rate. The reactants (i.e., $SiH_4$ and $SiCl_4$) may be provided for a period ranging from about 60 seconds to about 3,600 seconds to produce polycrystalline silicon layer 410 having a thickness ranging from about 500 Å to about 3,000 Å. It should be understood that the particular flow rates, pressure range, temperature range, duration and other parameters may be adjusted based on the desired thickness of polycrystalline layer 410.

Similar to the discussion above with respect to using $SiH_4$ and $SiH_2Cl_2$ reactants, using $SiH_4$ and $SiCl_4$ at a ratio ranging from approximately a 1:10 to 10:1 (with respect to flow rates) results in better gap filling properties associated with polycrystalline layer 410, even when the aspect ratio of the gap, such as gap 340, is high. It has also been found that using $SiH_4$ and $SiCl_4$ at a ratio ranging from approximately 1:10 to 10:1 produces less hydrogen gas byproduct as compared to using $SiH_4$ alone. As discussed above, hydrogen gas may be absorbed into polycrystalline silicon layer 410, thereby causing problems in polycrystalline silicon layer 410. Therefore, reducing the amount of hydrogen byproduct using $SiH_4$ and $SiCl_4$ advantageously reduces or eliminates the problems created by hydrogen being absorbed into polycrystalline silicon layer 410.

Therefore, in both of the exemplary implementations described above, the deposited polycrystalline silicon layer 410 is able to fill small gaps, such as gap 340, even when the aspect ratio of gap 340 is high. In addition, the deposition processes described above advantageously reduce the amount of hydrogen byproduct produced, which further eliminates potential problems associated with polycrystalline silicon layer 410.

In another alternative embodiment consistent with the invention, polycrystalline layer 410 may be deposited using two separate deposition processes. In the first process, one of the two procedures discussed above may be used to deposit a liner layer of polycrystalline silicon. That is, $SiH_4$ and $SiH_2Cl_2$ may be used as reactants or $SiH_4$ and $SiCl_4$ may be used as reactants to form a layer of polycrystalline silicon 410 having a thickness ranging from about 50 Å to about 500 Å. This first layer of polycrystalline silicon forms a portion of polycrystalline silicon layer 410 illustrated in FIG. 4 and acts as a liner layer for a subsequently deposited portion of polycrystalline silicon layer 410. The liner layer of polycrystalline silicon may exhibit good gap filling properties, as described above. That is, the portion of polycrystalline silicon layer 410 deposited in this manner advantageously enables polycrystalline layer 410 to fill gap 340 without voids, even when gap 340 has a high aspect ratio.

After the liner layer of polycrystalline silicon is formed, an $SiH_4$ based reaction may be used to complete the formation of polycrystalline silicon layer 410. That is, $SiH_4$ may be supplied to the CVD chamber as the reactant without the use of other reactants, such as $SiH_2Cl_2$ or $SiCl_4$. In other words, the $SiH_2Cl_2$ or $SiCl_4$ source used in the first deposition process may be shut off and $SiH_4$ gas may be continued to be supplied to the CVD chamber. The $SiH_4$, when heated, may react to deposit a layer of polycrystalline silicon over the liner layer of polycrystalline silicon. Together the two deposition processes form polycrystalline silicon layer 410.

In this embodiment, the amount of hydrogen gas produced in the second deposition process may be greater than that produced to form the liner layer portion of polycrystalline silicon layer 410. However, in this embodiment, the liner portion of polycrystalline silicon layer 410 has already filled the small gaps between structures 210, such as gap 340, and therefore, the $SiH_4$ based reaction may be used to complete the upper most portion of polycrystalline layer 410 without causing problems associated with polycrystalline silicon layer 410. In an exemplary implementation, the thickness of the upper portion of polycrystalline silicon layer 410 deposited using the $SiH_4$ based reaction may range from about 450 Å to about 2,950 Å.

In still another embodiment consistent with the invention, a portion of polycrystalline silicon layer 410 may be deposited using either $SiH_2Cl_2$ or $SiCl_4$, without the use of $SiH_4$. For example, $SiH_2Cl_2$ or $SiCl_4$ may be provided to the CVD chamber to deposit a portion of polycrystalline silicon layer 410 having a thickness ranging from about 50 Å to about 500 Å. Advantageously, the reaction involving either of these reactants (i.e., $SiH_2Cl_2$ or $SiCl_4$) may totally eliminate the formation of hydrogen byproducts. For example, heating the $SiH_2Cl_2$ in the CVD chamber may produce silicon and HCl gas. The HCl gas does not cause the same problems as hydrogen gas with respect to the deposited silicon. Therefore, forming a liner layer portion of polycrystalline silicon layer 410 in this manner reduces potential problems with polycrystalline silicon layer 410. The remaining portion of polycrystalline silicon layer 410 may be formed using a conventional $SiH_4$ based reaction.

In another embodiment, a portion of polycrystalline silicon layer 410 may be formed using $SiH_4$ and $Cl_2$ as reactants or $SiH_4$ and HCl as reactants. Similar to the discussion above with respect to forming the liner layer using $SiH_2Cl_2$ or $SiCl_4$, using $SiH_4$ and $Cl_2$ or $SiH_4$ and HCl may substantially reduce or totally eliminate the formation of hydrogen gas produced during the deposition. The remaining portion of polycrystalline silicon layer 410 may be formed using a conventional $SiH_4$ based reaction. Therefore, in this implementation, problems associated with hydrogen byproducts may be substantially reduced or eliminated.

In other exemplary embodiments consistent with the invention, any of the methods described above with respect to depositing a liner layer portion of polycrystalline silicon layer 410 may be used to deposit the entire polycrystalline silicon layer 410. That is, $SiH_2Cl_2$ or $SiCl_4$ may be used to deposit polycrystalline silicon layer 410, without the addition of $SiH_4$. Alternatively, $SiH_4$ with either $Cl_2$ or HCl may be used to deposit polycrystalline silicon layer 410.

The embodiments described above with respect to forming polycrystalline silicon layer 410 focus on using a chlorine containing compound, such as $SiH_2Cl_2$ or $SiCl_4$, as a reactant, with or without the use of SiH$_4$. In still other embodiments, other chlorine containing compounds, such as SiHCl$_3$ and/or SiH$_3$Cl, may be used as reactants with or without the use of SiH$_4$. Similar to the discussions above with respect to SiH$_2$Cl$_2$ and SiCl$_4$, depositing all or a portion of polycrystalline silicon layer 410 using SiHCl$_3$ or SiH$_3$Cl as a reactant results in better gap filling properties associated with polycrystalline silicon layer 410. In addition, using SiHCl$_3$ or SiH$_3$Cl may reduce the amount of hydrogen gas byproduct. The particular flow rates, pressure range, temperature range and duration associated with forming polycrystalline silicon layer 410 using SiHCl$_3$ or SiH$_3$Cl as one of the reactants may be similar to the ranges discussed above with respect to the reactions involving SiH$_2$Cl$_2$.

In each of the deposition processes described above, the amount of hydrogen byproduct produced during the deposition of polycrystalline silicon layer 410 may be reduced or eliminated since chlorine in one or more of the reactants may form HCl gas, as opposed to hydrogen gas being formed. It should be understood that the reactants described above used to form polycrystalline silicon layer 410 are exemplary only and other deposition processes may be used to form all or a portion of polycrystalline silicon layer 410. In each case, the amount of hydrogen gas produced is advantageously reduced or eliminated, thereby reducing potential problems associated with polycrystalline silicon layer 410. In addition, one of ordinary skill in the art would be able to optimize the flow rates, temperature ranges, pressure ranges, etc., associated with the deposition of polycrystalline silicon layer 410 given the guidance given herein.

Figure 5:
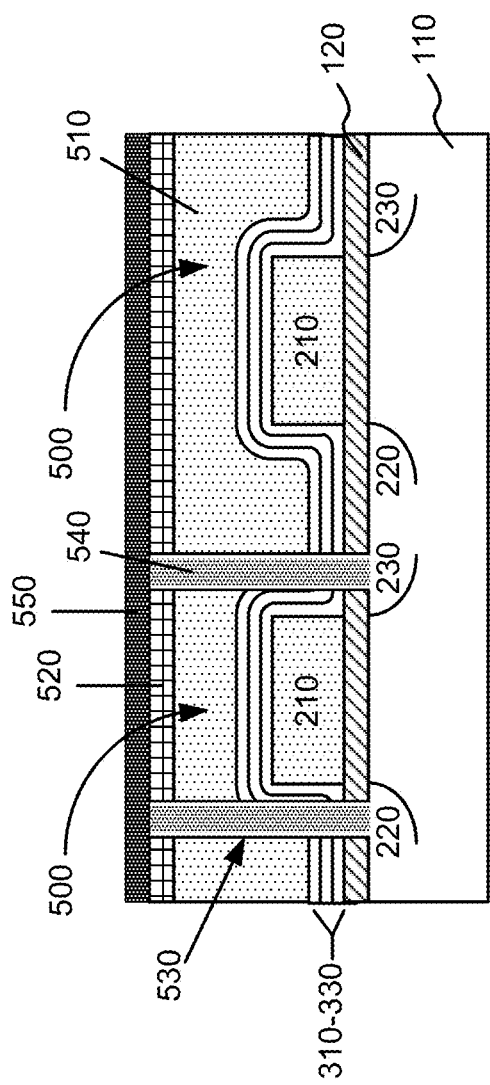
FIG. 5 is a cross-section illustrating the planarization of the control gate material of FIG. 4 in accordance with an embodiment of the invention.

Polycrystalline silicon layer 410, consistent with the invention, may be used to form one or more control gate electrodes for one or more memory cells in semiconductor device 100. In an exemplary implementation, polycrystalline silicon layer 410 may be planarized using, for example, a chemical-mechanical polishing (CMP), to form control gate 510 for a number of memory cells 500, as illustrated in FIG. 5. An optional silicide layer, such as titanium silicide (not shown) may also be formed on control gate 510.

Referring to FIG. 5, each memory cell 510 includes source and drain regions 220 and 230, a tunnel oxide layer 120, a charge storage structure 210, an inter-gate dielectric 310-330 and a control gate 510. The control gate 510 may represent a word line in a memory array that is connected to a large number of memory cells 500.

An interlayer dielectric 520, such as an oxide, may be formed on control gate 510. The ILD may optionally be planarized using a conventional process, such as a chemical-mechanical polishing (CMP) process, to planarize the top surface of the ILD to facilitate formation of subsequent structures, such as interconnect lines. The ILD may function to isolate various conductive structures, such as various interconnect lines described below or to isolate source region 220 or drain region 230 from other conductive structures.

A contact hole 530 may be formed in the ILD using conventional photolithographic and etching techniques. The contact hole may be used to form a contact to source region 220 or drain region 230. Next, a metal layer 540, such as tungsten, copper or aluminum, may be deposited to fill the contact hole. An interconnect 550 may then be formed over the planarized ILD. For example, a metal, such as tungsten, copper or aluminum, may be deposited to form a conductive line that connects various features in semiconductor device 100, such as source or drain regions 220/230 to an external electrode (not shown). The conductive line may facilitate programming or erasing various memory cells in semiconductor device 100.

Additional ILDs and metal lines may be formed to complete the fabrication of semiconductor device 100 based on the particular circuit requirement. For example, a top dielectric layer, also referred to as cap layer, may be formed over a top most conductive line. The cap layer may act as a protective layer to prevent damage to conductive lines and other portions of semiconductor device 100 during subsequent processing. For example, cap layer may protect semiconductor device 100 against impurity contamination during subsequent cleaning processes that may be used to complete a working memory device.

Each memory cell 500 in semiconductor device 100 may be an EEPROM type memory device and one or more programming circuits (not shown) may be used to facilitate programming and erasing of one or more memory cells 500 of semiconductor device 100. Programming of memory cells may be accomplished by applying a predetermined voltage to control gate 510. Once programmed, electrons remain stored in charge storage structure 210 until an erase procedure is performed.

As described above with respect to FIG. 1, in an exemplary embodiment consistent with the invention, semiconductor device 100 may be a floating gate memory device in which structures 210 may include a conductive material, such as polycrystalline silicon. In an alternative implementation described above with respect to FIG. 1, structures 210 may include a dielectric material, such as a silicon nitride. In this implementation, semiconductor device 100 illustrated in FIG. 5 may be a SONOS type memory device with a silicon control gate 510 formed on an oxide inter-gate dielectric, formed on a nitride charge storage structure 210. The nitride charge storage structure 210 may be formed on tunnel oxide layer 120 and a silicon substrate 110.

Further, in an exemplary implementation in which semiconductor device is a SONOS type memory device, each of memory cells 500 illustrated in FIG. 5 may be configured to store two bits of data. That is, each charge storage structure 210 may be programmed to store charges representing two separate bits of data by localizing the first and second charges to the respective left and right sides of each charge storage structure 210 illustrated in FIG. 5. Each of the two bits of memory cells 500 may be programmed independently by, for example, channel hot electron injection, to store charges representing a bit on each respective side of the charge storage structure 210. In this manner, the charges in charge storage structure 210 become effectively trapped on each respective side of charge storage structure 210. Erasing of each bit in memory cells 500 may also be performed independently. During erasing, the charges stored in charge storage structure 210 may tunnel through dielectric layer 120 into source region 220 and drain region 230, respectively. In this implementation, the density of the array of memory cells 500 in semiconductor device 100 may be increased as compared to conventional memory devices that store only one bit of data per cell.

In summary, implementations consistent with the invention form a polycrystalline silicon layer 140 with good gap filling properties, while reducing the amount of hydrogen gas formed. Advantageously, the polycrystalline silicon layer 410 may be formed without voids, gaps or other non-conductive regions. Memory cells 500 may therefore exhibit increased reliability and may be efficiently programmed and/or erased.

In the previous descriptions, numerous specific details are set forth, such as specific materials, structures, chemicals, processes, etc., in order to provide a thorough understanding of the invention. However, implementations consistent with principles of the invention can be practiced without resorting to the details specifically set forth herein. In other instances, well known processing structures have not been described in detail, in order not to unnecessarily obscure the thrust of the invention.

For example, the dielectric and conductive layers used in manufacturing a semiconductor device in accordance with the invention can be deposited by conventional deposition techniques. For example, various types of CVD processes, including plasma enhanced (PECVD) and low pressure chemical vapor deposition (LPCVD) can be employed. In addition, conventional electroplating, photolithographic and etching techniques may also be employed, and hence, the details of such techniques have not been set forth herein in detail.

Implementations of the invention are applicable in the manufacturing of semiconductor devices and particularly in memory devices having small design features and high circuit density. The invention is applicable to the formation of any of various types of semiconductor devices, and hence, details have not been set forth in order to avoid obscuring the thrust of the invention.

In addition, no element, act or process used in the description of the invention should be construed as critical or essential to the invention unless explicitly described as such. Also, as used herein, the article "a" is intended to include one or more items. Where only one item is intended, the term "one" or similar language is used.

Only the preferred embodiments of the invention and a few examples of its versatility are shown and described in the present disclosure. It is to be understood that the invention is capable of use in various other combinations and environments and is capable of modifications within the scope of the inventive concept as expressed herein.

What is claimed is:

1. A method of manufacturing a memory device, the method comprising:
    forming a dielectric layer over a substrate;
    forming a charge storage element over the dielectric layer;
    etching the charge storage element;
    forming an inter-gate dielectric over the dielectric layer and the etched charge storage element;
    depositing a polysilicon layer over the inter-gate dielectric, where depositing the polysilicon control gate layer includes:
        providing a first reactant to a deposition chamber, and
        providing a second reactant to the deposition chamber;
    planarizing the polysilicon layer to form a control gate;
    forming an interlayer dielectric on the control gate;
    planarizing the interlayer dielectric;
    forming, after forming the control gate and planarizing the interlayer dielectric, a contact hole through the planarized interlayer dielectric and the control gate;
    depositing a metal layer to fill the contact hole, the metal layer including a first type of metal; and
    forming an interconnect over the planarized interlayer dielectric, the interconnect including a second type of metal.

2. The method of claim 1, where the inter-gate dielectric includes a plurality of layers, and the plurality of layers include a nitride layer and at least one oxide layer.

3. The method of claim 1, where, when etching the charge storage element, the method further comprising:
    etching the charge storage element to create a plurality of structures.

4. The method of claim 1, where the polysilicon layer is planarized using chemical-mechanical polishing.

5. The method of claim 1, where a top surface of the interlayer dielectric is planarized using chemical-mechanical polishing.

6. The method of claim 1, where the first type of metal is one of tungsten, copper, or aluminum.

7. The method of claim 1, where the contact hole forms a contact to a source region or a drain region.

8. A method of manufacturing a memory device, the method comprising:
    forming a dielectric layer over a substrate;
    forming a charge storage element over the dielectric layer;
    etching the charge storage element;
    forming an inter-gate dielectric over the dielectric layer and the etched charge storage element;
    depositing a polysilicon layer over the inter-gate dielectric, where depositing the polysilicon control gate layer includes;
        providing a first reactant to a deposition chamber, and
        providing a second reactant to the deposition chamber, where the first reactant and the second reactant are concurrently provided to the deposition chamber;
    planarizing the polysilicon layer to form a control gate;
    forming an interlayer dielectric on the control gate;
    planarizing the interlayer dielectric;
    forming, after forming the control gate and planarizing the interlayer dielectric, a contact hole through the planarized interlayer dielectric and the control gate;
    depositing a metal layer to fill the contact hole, the metal layer including a first type of metal; and
    forming an interconnect over the planarized interlayer dielectric, the interconnect including a second type of metal.

9. The method of claim 8, where the inter-gate dielectric includes a plurality of layers, and the plurality of layers include a nitride layer and at least one oxide layer.

10. The method of claim 8, where, when etching the charge storage element, the method further comprising:
    etching the charge storage element to create a plurality of structures.

11. The method of claim 8, where the polysilicon layer is planarized using chemical-mechanical polishing.

12. The method of claim 8, where a top surface of the interlayer dielectric is planarized using chemical-mechanical polishing.

13. The method of claim 8, where the first type of metal is one of tungsten, copper, or aluminum.

14. The method of claim 8, where the contact hole forms a contact to a source region or a drain region.

15. A method of manufacturing a memory device, the method comprising:
    forming a dielectric layer over a substrate;
    forming a charge storage element over the dielectric layer;
    etching the charge storage element;
    forming an inter-gate dielectric over the dielectric layer and the etched charge storage element;
    depositing a polysilicon layer over the inter-gate dielectric, where depositing the polysilicon control gate layer includes:
        providing a $SiH_2Cl_2$ reactant to a deposition chamber, and
        providing a $SiH_4$ reactant to the deposition chamber;
    planarizing the polysilicon layer to form a control gate;
    forming an interlayer dielectric on the control gate;
    planarizing the interlayer dielectric;
    forming, after forming the control gate and planarizing the interlayer dielectric, a contact hole through the planarized interlayer dielectric and the control gate;

depositing a metal layer to fill the contact hole, the metal layer including a first type of metal; and forming an interconnect over the planarized interlayer dielectric, the interconnect including a second type of metal.

16. The method of claim 15, where the inter-gate dielectric includes a plurality of layers, and the plurality of layers include a nitride layer and at least one oxide layer.

17. The method of claim 15, where, when etching the charge storage element, the method further comprising:

etching the charge storage element to create a plurality of structures.

18. The method of claim 15, where the polysilicon layer is planarized using chemical-mechanical polishing.

19. The method of claim 15, where a top surface of the interlayer dielectric is planarized using chemical-mechanical polishing.

20. The method of claim 15, where the contact hole forms a contact to a source region or a drain region.

\* \* \* \* \*